(12) United States Patent
Liu et al.

(10) Patent No.: US 8,793,640 B1
(45) Date of Patent: Jul. 29, 2014

(54) METHODS AND APPARATUS FOR RC EXTRACTION

(71) Applicant: Taiwan Semiconductor Manufacturing Company, Ltd., Hsin-Chu (TW)

(72) Inventors: Te-Yu Liu, Xinpu Township (TW); Ke-Ying Su, Taipei (TW); Austin Chingyu Chiang, New Taipei (TW); Hsiao-Shu Chao, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/795,814

(22) Filed: Mar. 12, 2013

(51) Int. Cl.
*G06F 17/50* (2006.01)

(52) U.S. Cl.
USPC .......................................................... 716/136

(58) Field of Classification Search
USPC .................................................. 716/100, 136
See application file for complete search history.

(56) References Cited

U.S. PATENT DOCUMENTS

| | | | |
|---|---|---|---|
| 6,360,350 B1 * | 3/2002 | Gabele et al. | 716/113 |
| 6,526,549 B1 * | 2/2003 | You | 716/115 |
| 2004/0100286 A1 * | 5/2004 | Ramarao et al. | 324/677 |
| 2004/0103384 A1 * | 5/2004 | Tanaka | 716/8 |
| 2005/0012509 A1 * | 1/2005 | Ramarao et al. | 324/677 |
| 2007/0220459 A1 * | 9/2007 | Gurney | 716/5 |
| 2009/0001370 A1 * | 1/2009 | Lin | 257/48 |
| 2011/0078642 A1 * | 3/2011 | Elfadel et al. | 716/106 |

* cited by examiner

*Primary Examiner* — Suchin Parihar
(74) *Attorney, Agent, or Firm* — Slater and Matsil, L.L.P.

(57) ABSTRACT

The method for extracting a capacitance from a layout is disclosed. The method decomposes a first net into a first and a second component, and decomposes a second net into a third and a fourth component. The method may obtain a first capacitance for the first component and the third component by a first method, and obtain a second capacitance for the second component and the fourth component by a second method different from the first method. A library with a plurality of entries may be provided, wherein each entry has a component pair comprising a component of the first net and a component of the second net, and a pre-calculated capacitance for the component pair. The first method may be to search a library to find a pre-calculated capacitance. The second method may be to obtain the first capacitance by an equation solver on the fly.

19 Claims, 18 Drawing Sheets

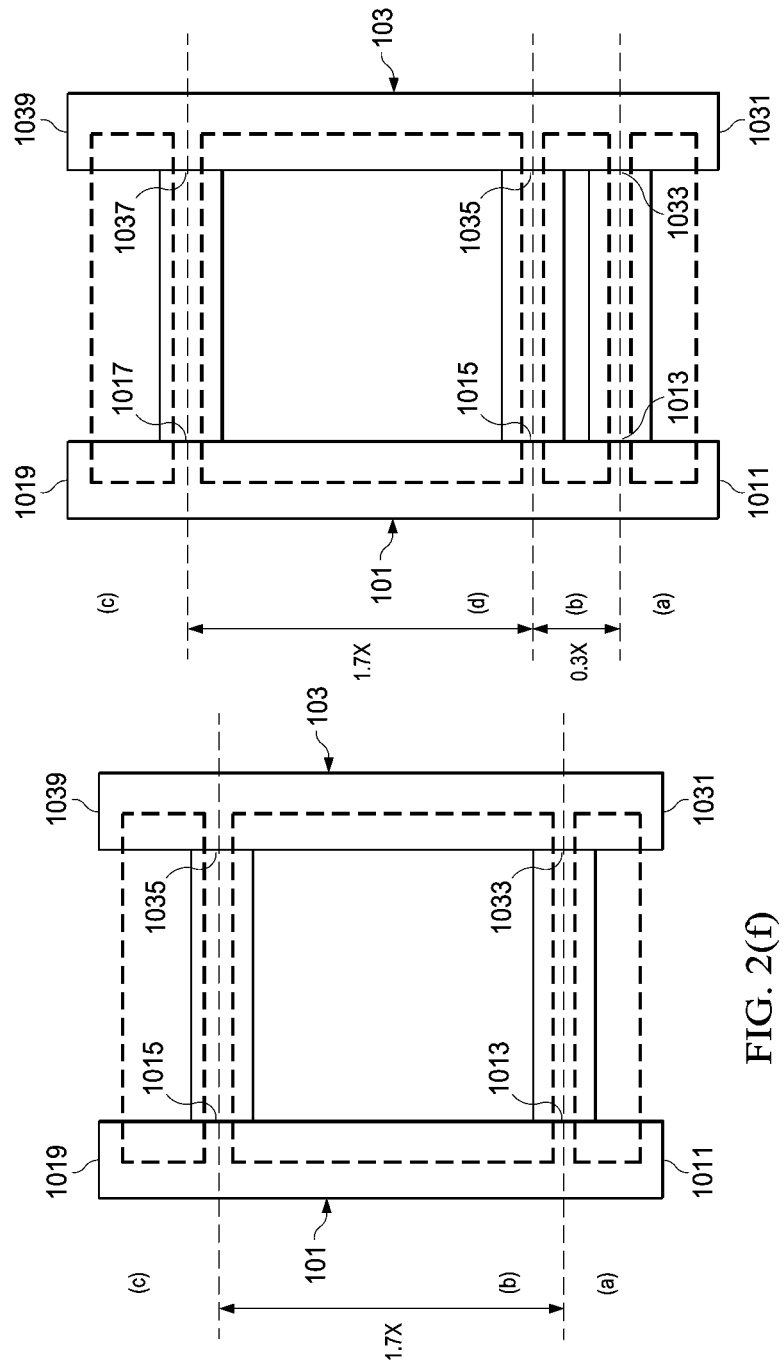

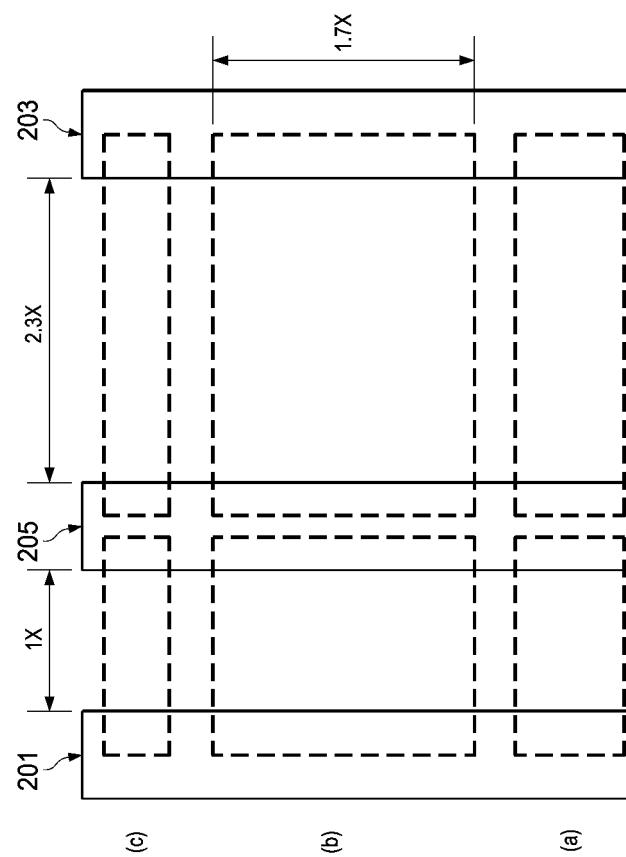

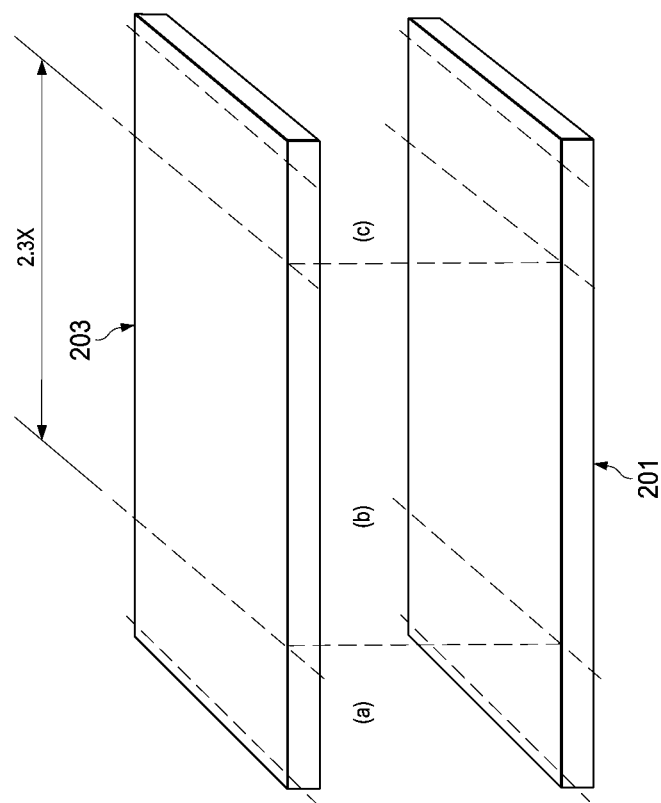

METHODS AND APPARATUS FOR RC EXTRACTION

BACKGROUND

Semiconductor devices are used in a variety of electronic applications, such as personal computers, cell phones, digital cameras, and other electronic equipment, as examples. Semiconductor devices comprise integrated circuits (IC) that are formed on semiconductor wafers by depositing many types of thin films of materials over the semiconductor wafers. The thin films are patterned to form electronic components, such as transistors, diodes, resistors, capacitors, etc. The transistors may be metal-oxide-semiconductor field-effect transistors (MOSFET), or fin field-effect transistors (FinFET). ICs are increasingly more complex with millions of components such as transistors connected together to perform intended functions.

An IC may be created by a design process starting with a software description, e.g., in a programming language such as C or VHDL, of the functionality of the circuit. The software description is then synthesized to interconnected gate-level hardware elements. Next the hardware elements and their connections are physically laid out, represented as placements of geometric shapes, often referred to as a layout, on a variety of layers to be fabricated on semiconductor wafers. In general, the geometric descriptions are polygons of various dimensions, representing conductive or non-conductive features located in different layers over the semiconductor wafers. After the IC design process is completed, an IC layout is created. The layout is then design-rule checked and verified to be equivalent with the desired design schematic. This step is generally referred to as design-rule check (DRC) and layout versus schematic (LVS).

As minimal features of electronic components are decreasing, interactions are increasing among transistors in closer proximity, as well as between transistors and interconnect layers. Parasitic circuit elements are increasingly affecting the performance of an IC. The resistance and capacitance (RC) extraction step, also called as parasitic extraction, is performed following the DRC and LVS step, in order to extract electrical characteristics of the layout. The RC extraction step converts a physical design layout back into representative electrical circuit elements, and measures the actual shapes and spaces in the layers of a layout to predict the resulting electrical characteristics of the manufactured chip. The electrical characteristics that are commonly extracted from a physical design layout include capacitance and resistance in the electronic devices and on the various interconnects, which are generally referred to as "nets", that electrically connect the aforementioned devices.

Various Electronic Design Automation ("EDA") or Computer Aided Design (CAD) tools may be used in the design process to handle the complexity of the design, and to perform the DRC, LVS, and RC extraction. Current CAD tools for RC extraction have issues with accuracy, and speed, and may not be able to handle FinFET process well. New methods and apparatus are needed to achieve high accuracy, fast speed, and for FinFET process.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 2(a)-2(h) illustrate various examples for the capacitance extraction of two nets in a middle end of line (MEOL) layer, in accordance with some embodiments;

FIGS. 3(a)-3(i) illustrate various examples for the capacitance extraction of two nets in a back end of the line (BEOL) layer, in accordance with some embodiments;

FIGS. 4(a)-4(b) illustrate various examples for the capacitance extraction of two nets in overlay layers, in accordance with some embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1A:
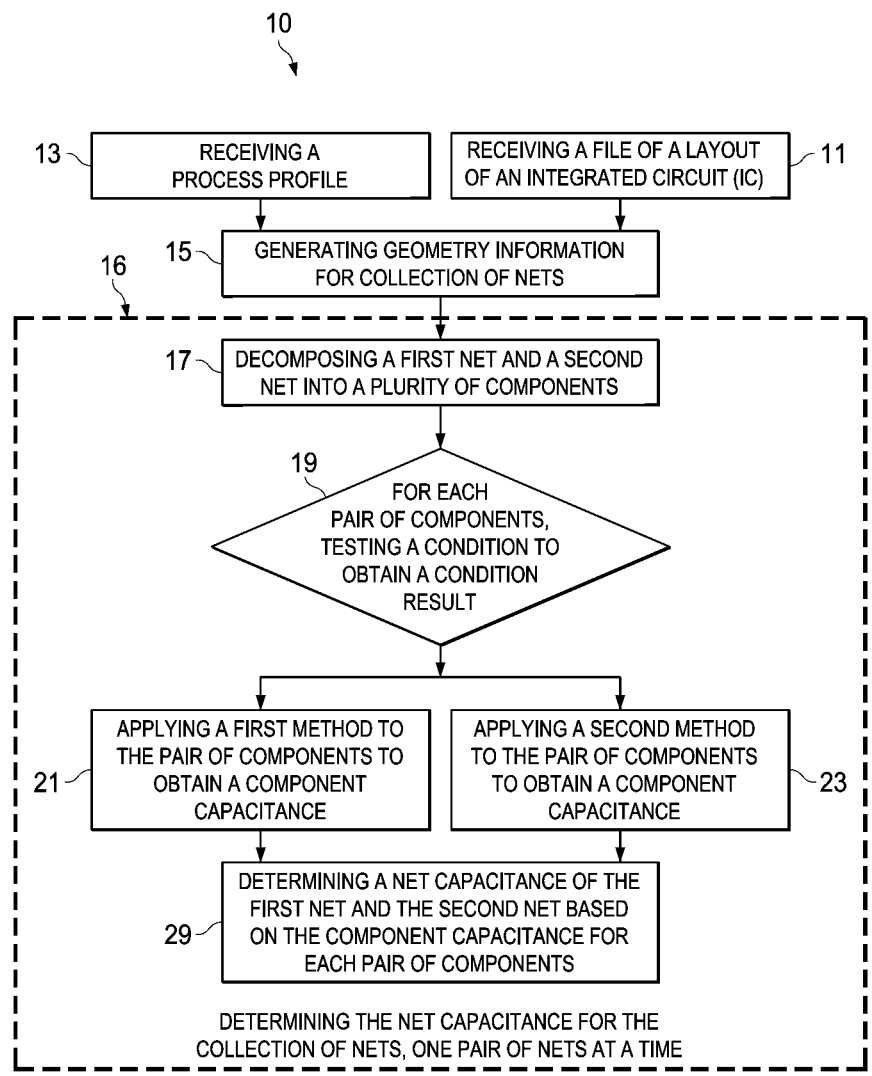
FIGS. 1(a)-1(b) illustrate exemplary methods for the capacitance extraction of an integrated circuit (IC) layout with a plurality of nets, in accordance with some embodiments.

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely the methods and systems for the capacitance extraction of a layout of an integrated circuit (IC). The method extracts the capacitance of a pair of nets at a time. The method for extracting a capacitance decomposes a first net into a first component and a second component, and decomposes a second net into a third component and a fourth component. The method then tests a condition for the first component and the third component to obtain a first condition result, and tests a condition for the second component and the fourth component to obtain a second condition result. The method may obtain a first capacitance for the first component and the third component by a first method, and obtain a second capacitance for the second component and the fourth component by a second method different from the first method. A library with a plurality of entries may be provided, wherein each entry has a component pair comprising a component of the first net and a component of the second net, and a pre-calculated capacitance for the component pair. Testing the first condition may be to search the library to find whether there is a matching entry in the library, the first condition result is yes when there is a matching entry found, and no for otherwise. The first method may be to find the pre-calculated capacitance stored in the library for a matching entry of the component pair, and the second method may be to obtain the component capacitance by an equation solver on the fly.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1B:
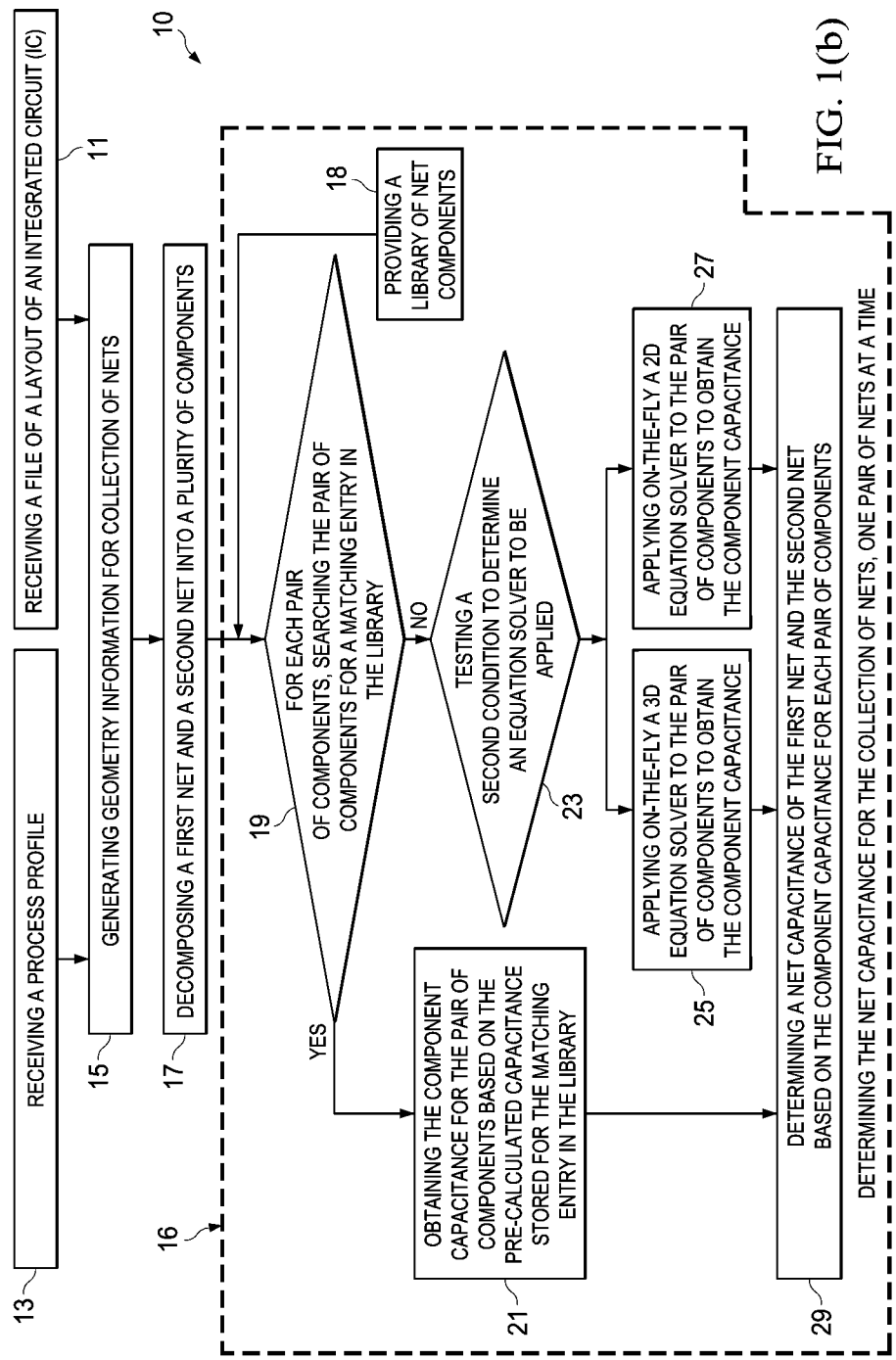

FIGS. 1(a)-1(b) illustrate exemplary methods for capacitance extraction of an integrated circuit (IC) layout with a plurality of nets, in accordance with some embodiments. FIG. 1(a) illustrates a general method, while FIG. 1(b) illustrates a more specific example.

FIG. 1(a) illustrates a method 10 for capacitance extraction of an integrated circuit (IC) layout with a plurality of nets. At step 11, the method 10 receives a file of a layout of an integrated circuit (IC). At step 13, the method 10 receives a process profile. At step 15, the method 10 generates the geometry information for a collection of nets contained in the layout. At step 16, the method determines the net capacitance for the collection of nets, one pair of nets at a time. There may be many pairs of nets within the layout file. Therefore step 16 may be performed many times. Step 16 may comprise many sub-steps, as shown within the square marked by step 16.

The following steps are performed within step 16 to compute the net capacitance of a pair of nets. At step 17, the method 10 decomposes a first net and a second net into a plurality of components. At step 19a, for each pair of components, the method 10 tests a condition to obtain a condition result. Based on the condition result, the method 10 may apply a first method to the pair of components to obtain a component capacitance at step 21a. Alternatively, the method 10 may apply a second method to the pair of components to obtain a component capacitance at step 23a. At step 29, the method 10 determines a net capacitance of the first net and the second net based on the component capacitance for each pair of components. Step 19a, step 21a, and step 23a are general steps and may have different implementations and embodiments. For example, step 19b and step 18 shown in FIG. 1(b) are an embodiment of step 19a. Step 21b shown in FIG. 1(b) is an embodiment of step 21a. Steps 23b in addition to step 25 and step 27 shown in FIG. 1(b) are an embodiment of step 23a.

The method 10 is for capacitance extraction for all nets within the layout of the IC, therefore it can be used for a chip level capacitance extraction. The capacitance extraction is performed one pair of nets at a time according to step 16. The nets can be given in a two dimensional, or a three dimensional space. A capacitance of a pair of nets can be an overlay capacitance due to the overlap of two nets in different layers, a lateral capacitance between two nets in the same layer, or a fringe capacitance between two nets in different layers. More details of each step in method 10 are explained below.

At step 11, the method 10 receives a file of a layout of an IC. The IC layout defines the specific dimensions of the gates, wells, diffusion areas, oxidation regions, capacitors, contacts, vias, passivation openings, isolation regions, interconnects, and other device elements that form the semiconductor devices. The layout usually represents these shapes with polygons or other geometric shapes, which may be created using CAD systems and tools.

The layout received at step 11 can be in many different formats. They may be called a layout file, or a layout database. The Graphic Data System II (GDSII) format is a popular format for 2D graphical IC layout data. Other formats include an open source format named Open Access, Milkyway by Synopsys, Inc., Electronic Design Data Model (EDDM) by Mentor Graphics, Inc., and Open Artwork System Interchange Standard (OASIS) proposed by Semiconductor Equipment and Materials International (SEMI). Any of these and any other future developed layout format are intended to be included within the scope of the present disclosure.

At step 13, the method 10 receives a process profile. The process profile may comprise information relating to the fabrication process for the IC layout. Information in the process profile may include, but not limited to, structure profiles, device attributes such as capacitance, inductance, and resistance and ultimately circuit attributes. It may also contain information such as process control parameters, and process attributes available during the fabrication process. The process file may contain any other information needed to fabricate the IC based on the layout files received at step 11.

At step 15, the method 10 generates the geometry information for a collection of nets contained in the layout. The layout received at step 11 may comprise a plurality of nets. Geometry information may comprise the length, the width, the height, the location, the relative position, and the metal layers of the nets. Geometry information may also comprise positions of other devices such as the positions of the fins of FinFET transistors. Geometry information may be derived from layout elements such as polygons, paths or poly-lines, trapezoids, circles and textboxes, or other geometrical objects. For the non-rectangular shapes, the equivalent number of squares may be derived. Some shapes may still be ignored, such as irregular shapes or non-45 degree edges. The geometry information of layout elements may be identified by a global coordinate system. The geometry information of layout elements may be identified in other ways, such as defined locally as a placement related to other layout elements.

At step 16, the method 10 determines the net capacitance for the collection of nets, one pair of nets at a time. There may be many pairs of nets within the layout file. Therefore step 16 may be performed many times. Step 16 comprises many sub-steps, as shown within the square marked by step 16. In short, step 16 is a summary of steps starting from step 17 and ending at step 29. Different steps may be used for step 16 at different embodiments.

At step 17, for each pair of nets comprising a first net and a second net, the method 10 decomposes the first net and the second net into a plurality of components. There may be various number of components. For example, the first net may be decomposed into a first component and a second component, and the second net may be decomposed into a third component and a fourth component. The first component may be at an end point of the first net, and a second component may comprise a middle point of the first net. Alternatively, the first component may be above two fins of a FinFET transistor for the first net. More details of the decomposition of the first net and the second net into various components are shown in FIGS. 2(*a*)-2(*h*) and FIGS. 3(*a*)-3(*i*).

At step 19*a*, for each pair of components, the method 10 tests a condition to obtain a condition result. The testing of a condition may be a pattern matching, or comparison of sizes such as to compare a length and a width of the component with a length and a width of a similar component stored in a database or a library. More details of the testing of a condition may be shown in the descriptions for FIGS. 2(*a*)-2(*h*) and FIGS. 3(*a*)-3(*i*).

Based on the condition result, the method 10 may apply a first method to the pair of components to obtain a component capacitance at step 21*a*. Alternatively, the method 10 may apply a second method to the pair of components to obtain a component capacitance at step 23*a*. FIG. 1(*a*) is only for illustrative purposes and are not limiting. There may be more than two methods to be applied to obtain the component capacitance depending on the condition result. For example, there may be a third method applied to obtain the component capacitance depending on the condition result.

The first method and the second method may be selected among various methods for capacitance calculation, such as an one-dimensional (1D) method, a two dimensional (2D) method, a three-dimensional (3D) method, a quasi-three dimensional (2.5D) method. There may be other methods used, such as rule based methods, formula based methods using empirical equations, or table lookup. Any other capacitance extraction methods in use or developed in the future may be included in the scope of the present disclosure. One method is different from another method if they use a different algorithms or different sequence of steps. Merely different input parameters to one method may produce different calculation, but those different calculation steps are not of different method.

A 1D capacitance extraction method may calculate the capacitance by the areas and perimeters of the net geometries based on a linear formula. Usually, the 1D method may work well when the nets are within one layer or two. However, there may be other situations when the 1D method may work well and they are all intended to be included within the scope of the present disclosure.

A 2D capacitance extraction method may calculate the capacitance by more accurate geometry modeling and numerical techniques. The 2D method may ignore three dimensional details and assume that the geometries of the nets are uniform in one dimension. The 2D method may work well for some particular cases such as the transmission lines.

A 2.5D capacitance extraction method is based on a 2D scanning approach. In the 2.5D method, a three dimensional structures are cut into 2D slides along the scanning direction. Once 2D cross-sections are formed, the 2D capacitance on each cross section is determined. Then the corresponding 2.5D, or quasi-3D, capacitance is constructed based on the 2D cross-section capacitance information.

A 3D capacitance extraction method are based on integral equations or differential equations, using full three dimensional geometry information such as the crossing wires in adjacent metal layers. The differential equation solver may be a differential Maxwell equation solver using the finite difference method or the finite element method.

At step 29, the method 10 determines a net capacitance of the first net and the second net based on the component capacitance for each pair of components. The net capacitance of the first net and the second net may be the sum of all the component capacitance for each pair of components. Other formula may be used to determine the net capacitance based on the component capacitance for each pair of components.

FIG. 1(*b*) illustrates a more specific example of a method 10 for capacitance extraction of an IC layout with a plurality of nets. The difference between the method 10 in FIG. 1(*a*) and the method 10 in FIG. 1(*b*) lies on step 16, where different and more specific steps are used for determining the net capacitance of a first net and a second net. For steps 11, 13, and 15, which precede step 16, the method 10 in FIG. 1(*b*) are substantially the same as the corresponding steps in FIG. 1(*a*), which will not be described again.

As illustrated in FIG. 1(*b*), at step 17, the method 10 decomposes a first net and a second net into a plurality of components. Step 17 shown in FIG. 1(*b*) may be similar to Step 17 shown in FIG. 1(*a*), where the method 10 decomposes the first net and the second net into a plurality of components. More details of the decomposition of the first net and the second net into various components are shown in FIGS. 2(*a*)-2(*h*) and FIGS. 3(*a*)-3(*i*) by examples.

At step 18, a library of net components is provided. The library has a plurality of entries. Each entry has a pair of net components with a pre-calculated capacitance for the pair of net components. A pair of net components comprises a component of the first net and a component of the second net. The pre-calculated capacitance for the pair of net components can be readily available if a pair of components is stored in the library. Therefore the use of the library can save time in determining the capacitance for a pair of components. The library may be a techfile for the capacitance of net components calculated using a 2.5D capacitance extraction method. The library may be other kind of capacitances calculated using other methods as well.

At step 19*b*, for each pair of components, the method 10 tests a condition to obtain a condition result. The testing of the condition for a pair of components may be to search the library provided at step 18 to find whether there is a matching entry for the pair of components. If there is a matching entry for the pair of components, the condition result is a positive YES; otherwise, the condition result is a negative NO.

Searching of the library may be performed by three dimensional parameters such as a length, a width, and/or a height of the net components.

At step 21b, the method 10 obtains the component capacitance for the pair of components based on the pre-calculated capacitance stored for the matching entry in the library when the condition result at step 19b is yes, which indicates there is a matching entry in the library for the pair of components. This is a very fast way to obtain the component capacitance since very little or no calculation is needed. However, the effectiveness of this step depends on the size of the library and the layout being extracted for capacitance. If the size of the library becomes too large, the search speed itself may slow down as well. It may be advantageous to store the capacitances for regular patterns only in the library without storing the capacitances for irregular patterns to reduce the library size. When the layout being extracted for capacitance is not regular, other methods may be used to obtain the component capacitance.

At step 23b, the method 10 tests a second condition to determine an equation solver to be applied to the pair of components, when the condition result at step 19b is no, indicating there is no matching entry in the library for the pair of components. The equation solver may be a 2D equation solver or a 3D equation solver. The testing of a second condition at step 23b is optional. The method 10 may directly determine to apply an equation solver after step 19b without testing the second condition.

At step 25, the method 10 applies a 3D equation solver on the fly to obtain the component capacitance for the pair of components under consideration. Alternatively, the method 10 applies a 2D equation solver on the fly to obtain the component capacitance for the pair of components under consideration at step 27. When there is no matching entry in the library for the pair of components, the 3D or 2D equation solver on the fly can be applied to obtain the component capacitance for the pair of components. The 3D or 2D equation solver generally can obtain the component capacitance with greater accuracy, but it is more time consuming. Therefore the 3D or 2D equation solver may be used for irregular components while the component capacitance for regular components can be found in the library at step 21b. By doing so, the method 10 may achieve a balance for accuracy, computing resources, and time performance.

At step 29, the method 10 similarly determines a net capacitance of the first net and the second net based on the component capacitance for each pair of components, as illustrated in FIG. 1(a). The net capacitance of the first net and the second net may be the sum of all the component capacitance for each pair of components. Other formula may be used to determine the net capacitance based on the component capacitance for each pair of components.

FIGS. 2(a)-2(h) illustrate various examples for capacitance extraction of a net 101 and a net 103 in a middle end of line (MEOL) layer, by performing step 16 of the method 10 shown in FIGS. 1(a)-1(b). The steps preceding step 16 are not shown. The input to step 16 is the geometry information generated from the layout file provided at step 11. The following paragraph describes the geometry information in general terms, instead of the accurate geometry information which may be processed by a computer file.

As illustrated in FIGS. 2(a)-2(h), the first net 101 and the second net 103 are at a MEOL layer, above a plurality of fins such as a first fin 203 and a second fin 205 of a FinFET transistor. The end points of the first net 101 are 1011 and 1019 respectively, while the end points of the second net 103 are 1031 and 1039 respectively. The first fin 203 has a cross section point 1013 at the first net 101, and a cross section point 1033 at the second net 103. The second fin 205 has a cross section point 1015 at the first net 101, and a cross section point 1035 at the second net 103. The number of fins 203 and 205 are only for illustration purposes and is not limiting. For example, an additional fin 207 is further illustrated in FIGS. 2(c) and 2(g), with a cross section point 1017 at the first net 101, and a cross section point 1037 at the second net 103. FIGS. 2(a), 2(c), 2(e), and 2(g) show a three dimensional view of the nets 101 and 103 with a plurality of fins, while FIGS. 2(b), 2(d), 2(f), and 2(h) show a top view of the nets 101 and 103 with a plurality of fins.

The geometry information described above can be used to decompose the net 101 and the net 103 into a plurality of components at step 17 of the method 10 shown in FIGS. 1(a)-1(b).

Figure 2A:
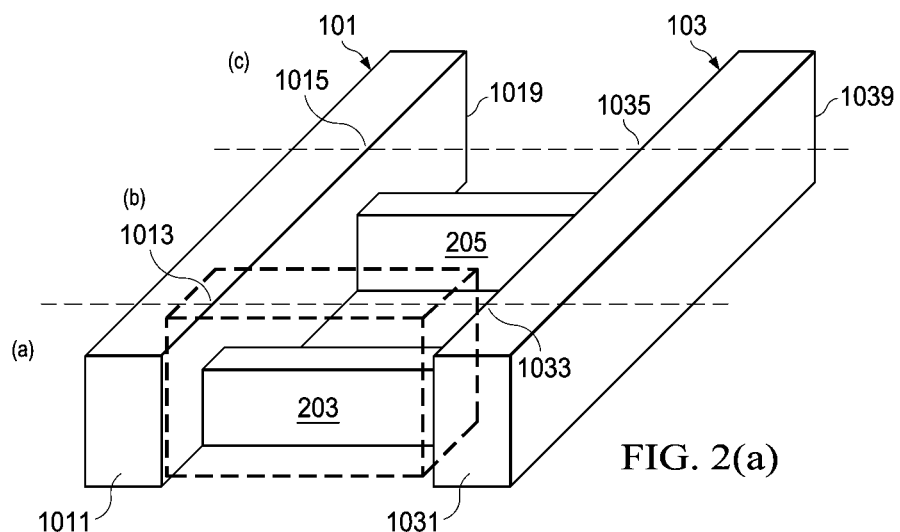
Figure 2B:
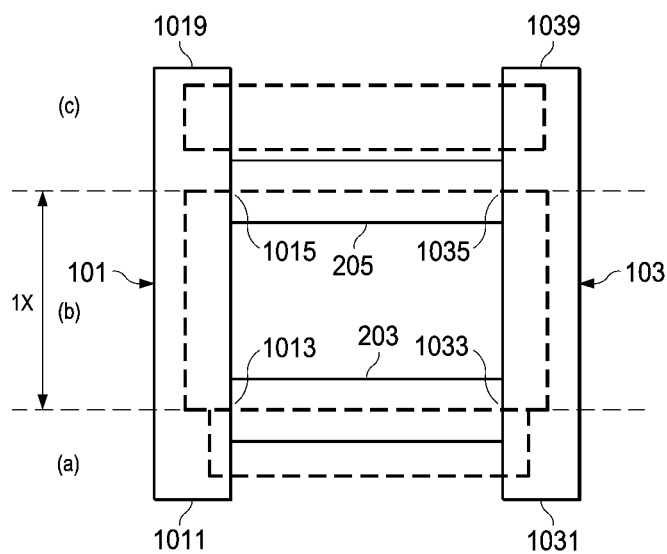
Figure 2C:
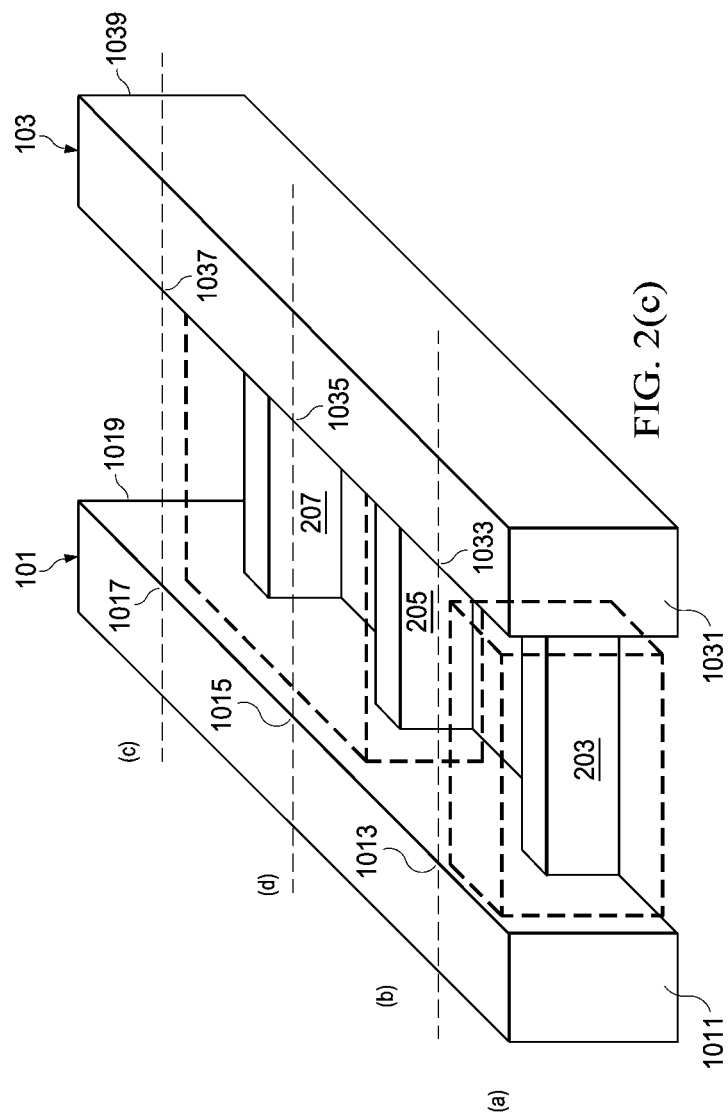
Figure 2D:
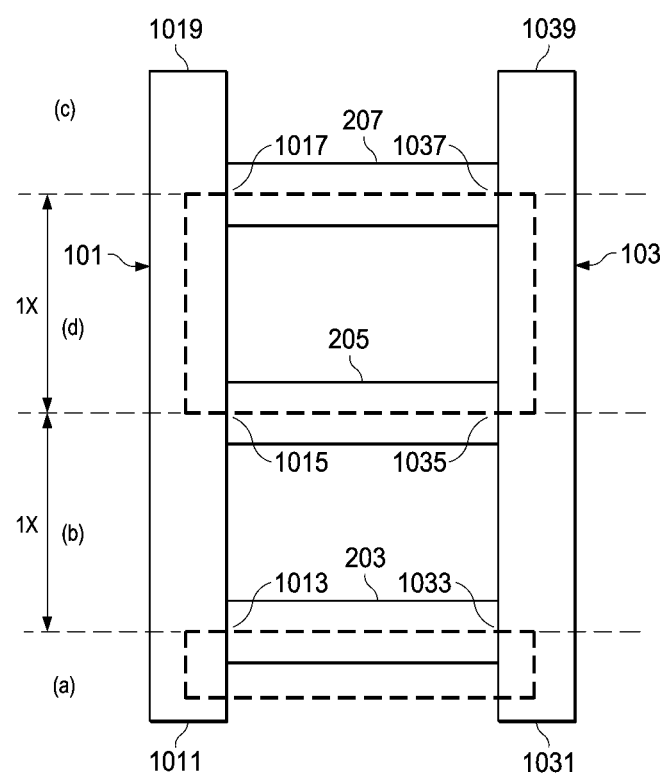
Figure 2E:
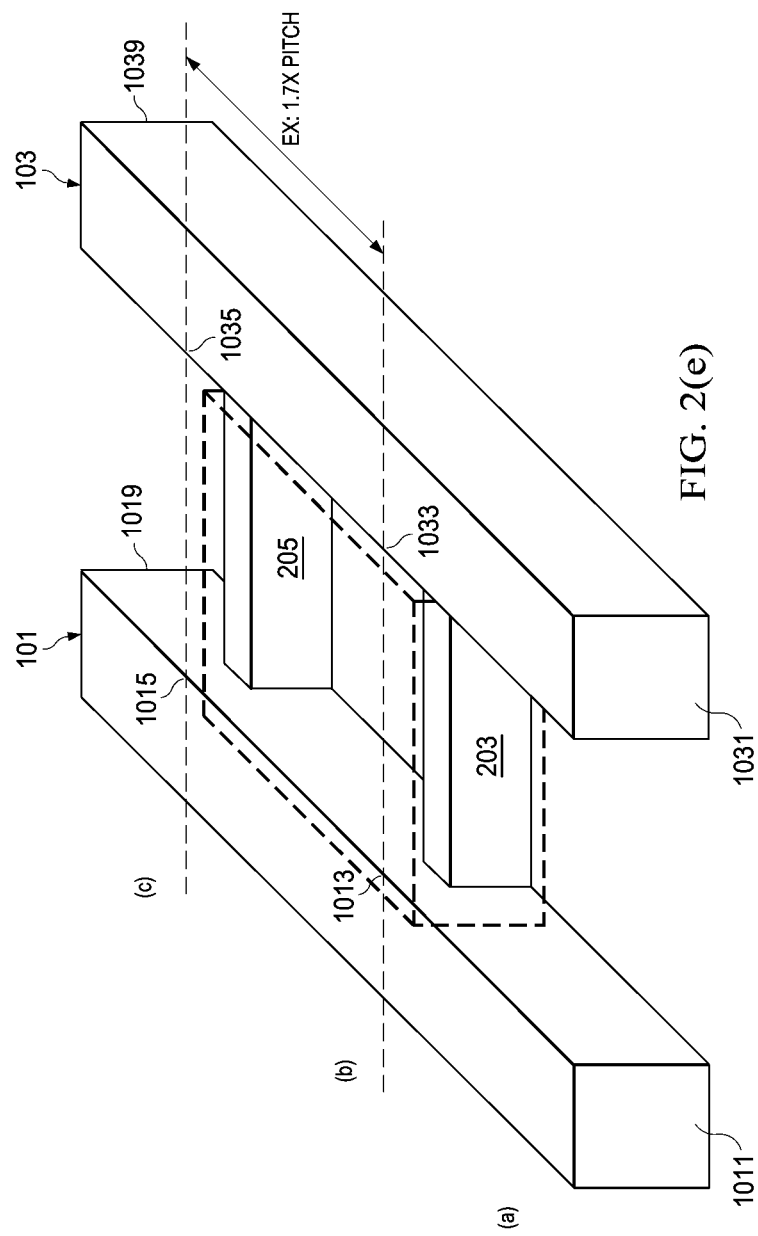

As illustrated in FIGS. 2(a) and FIG. 2(e) in a three dimensional view, and in FIGS. 2(b) and 2(f) in a two dimensional view, the first net 101 and the second net 103 may be decomposed into three different pairs of components. The first pair of components is marked as the (a) pair comprising a component (1011, 1013) of the first net 101, and a component (1031, 1033) of the second net 103. The second pair of components is marked as the (b) pair comprising a component (1013, 1015) of the first net 101, and a component (1033, 1035) of the second net 103. The third pair of components is marked as the (c) pair comprising a component (1015, 1019) of the first net 101, and a component (1035, 1039) of the second net 103. Among them, the first pair (a) and the third pair (c) are pairs of components comprising an end point of the net 101 and the net 103, while the pair (b) is a pair comprising a component at the middle of the net 101 and the net 103, above and between two fins 203 and 205.

Figure 2G:
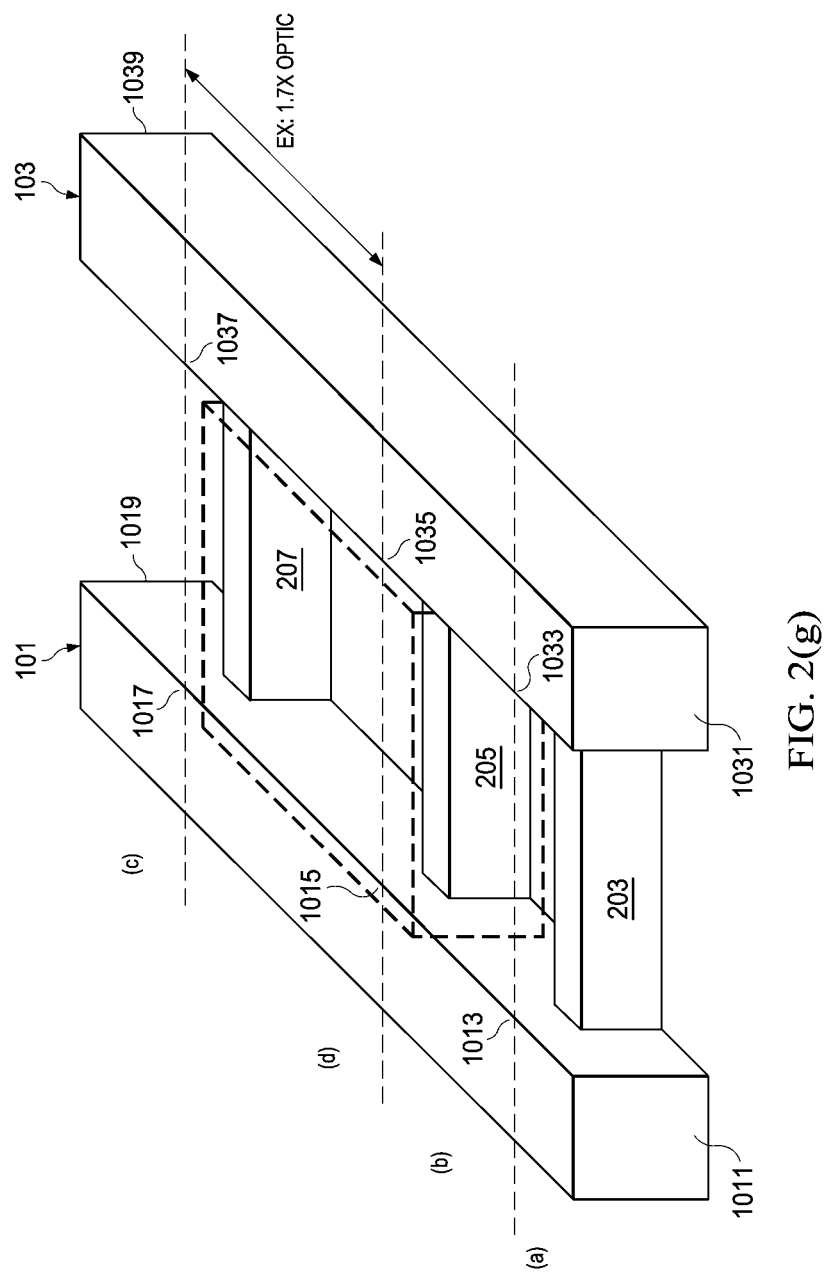

As illustrated in FIGS. 2(c) and 2(g) in a three dimensional view, and in FIGS. 2(d) and 2(h) in a two dimensional view, an additional fin 207 may create a different decomposition of the net 101 and the net 103. There is an additional pair of components (d) comprising the component (1015, 1017) of the first net 101, and the component (1035, 1037) of the second net 103, formed above and between two fins 205 and 207. Other pairs of components of FIGS. 2(c) and 2(g) are similar to the pairs of components of FIGS. 2(a) and 2(e).

For the example in FIGS. 2(a)-2(h), a library of net components may be provided at step 18 of the method 10 shown in FIG. 1(b). The library may be a techfile for a 2.5D capacitance extraction method. Each entry of the library may comprise a component pair and a pre-calculated capacitance for the component pair, wherein the component pair has a component of the first net and a component of the second net. The 2.5D techfile library may be derived using a 3D equation solver which determines the capacitance of a plurality of net components ahead of time.

After net 101 and the net 103 have been decomposed into a plurality of components at step 17 as described above, component capacitances of pairs of components can be obtained by first applying step 19b of the method 10 shown in FIG. 1(b). For each pair of components described above, step 19b tests a condition to obtain a condition result, which will be used to determine how to obtain the component capacitance for the pair of components.

When applying step 19b to examples in FIGS. 2(a)-2(h), each pair of components is searched in the library provided in step 18. For example, the first pair (a) shown in FIGS. 2(a)-2(h) is tested by searching the library of net components. The pair (a) is a regular pattern with a regular length and width, and the library has a matching entry. The search of the library may be performed by a height, length, and width of the components. Similarly, a match for the pair (c) in FIGS. 2(a)-2(h) may be found as well in the library. In addition, for the pairs (b) and (d) shown in FIGS. 2(a)-2(d), the length for the pairs (b) and (d) is regular, which is marked as 1X, therefore they can be found in the library as well. The condition results for the test in step 19b for the pairs (a), (c), and pairs (b) and (d) in FIGS. 2(a)-2(d) are a positive Yes.

On the other hand, the pair (b) of FIGS. 2(e)-2(h) has a length of 1.7X or 0.3X as marked, and it cannot be found in the library. Similarly, the pair (d) of FIGS. 2(e)-2(h) has a length of 1.7X as marked, and it cannot be found in the library. The condition results for the test in step 19b for the pairs (b) and the pair (d) of FIGS. 2(e)-2(h) are an negative No.

At step 21b, the method 10 obtains the component capacitance for the pair of components based on the pre-calculated capacitance for the matching entry in the library when the condition result at step 19b is yes. Based on the search result in step 19b, the method 10 can find the component capacitance for the (a) pair and (c) pair of components from the capacitance stored in the matching entry in the library. The component capacitance for the (a) pair may be equal to the pre-calculated and stored component capacitance $(a)_{techfile}$ in the library. Alternatively, the component capacitance for the (a) pair may be equal to $(a)_{techfile}*L$, which is the pre-calculated and stored component unit capacitance multiplied by a length L of the (a) pair if the stored capacitance value is a unit value instead of the whole value. The method 10 can find the capacitances of the (b) pair, the (c) pair, and (d) pair of components in the cases shown in FIGS. 2(a)-2(d), as $(b)_{techfile}$, $(c)_{techfile}$, and $(d)_{techfile}$, but not for the (b) pair and (d) pair in the cases shown in FIGS. 2(e)-2(h).

For the pairs (b) and (d) shown in FIGS. 2(e)-2(h), step 23b may be applied to test a second condition to determine an equation solver to be applied, since there is no matching entry in the library. The equation solver may be a 2D equation solver or a 3D equation solver. The second test at step 23b may be to test the layer the pairs (b) and (d) are at. For the example shown in FIGS. 2(e)-2(h), the pair (b) is at a MEOL layer and the method 10 may apply a 3D equation solver to extract the capacitance for the pair (b) in FIG. 2(e). However, if the pair (b) is given in a two dimensional space as in FIG. 2(f), then there may not be a test at step 23b since the equation solver would have to be a two dimensional equation solver since no three dimensional geometry information is available.

At step 25 or step 27, the method 10 applies a 3D equation solver or a 2D equation solver on the fly to obtain the component capacitance for the pairs (b) and (d) shown in FIGS. 2(e)-2(h), to obtain the component capacitance result as $(b)_{on\text{-}the\text{-}fly\ calculation}$ and $(d)_{on\text{-}the\text{-}fly\ calculation}$. Any of the current or future developed 2D or 3D equation solver may be used to obtain the component capacitance for the pairs (b) and (d) shown in FIGS. 2(e)-2(h).

Finally, at step 29, the method 10 determines a net capacitance of the first net and the second net based on the component capacitance for each pair of components. For example, for the first net 101 and the second net 103 in FIGS. 2(a) and 2(b), the net capacitance may be a sum of the component capacitance of each pair of components which are all stored in the library, $C_{101,103}=(a)_{techfile}*L+(b)_{techfile}+(c)_{techfile}*L$. Similarly, for the first net 101 and the second net 103 in FIGS. 2(c)-2(d), the net capacitance may be a sum of the component capacitance of each pair of components which are all stored in the library, $C_{101,103}=(a)_{techfile}*L+(b)_{techfile}+(c)_{techfile}*L+(d)_{techfile}$. On the other hand, for the net 101 and net 103 in FIGS. 2(e)-2(f), the net capacitance may be a sum of the component capacitance of each pair of components, $C_{101,103}=(a)_{techfile}*L+(b)_{on\text{-}the\text{-}fly\ calculation}+(c)_{techfile}*L$, where the (b) pair component capacitance may be solved on the fly. Similarly, for the nets 101 and 103 in FIGS. 2(g)-2(h), the net capacitance may be a sum of the component capacitance of each pair of components, $C_{101,103}=(a)_{techfile}*L+(b)_{on\text{-}the\text{-}fly\ calculation}+(d)_{on\text{-}the\text{-}fly\ calculation}+(c)_{techfile}*L$, where the (b) pair and (d) pair component capacitance may be solved on the fly.

FIGS. 3(a)-3(i) illustrate various exemplary methods for capacitance extraction of two nets 201 and 203 in a back end of line (BEOL) metal layer, in accordance with some embodiments. The method illustrated in FIG. 1(a) or FIG. 1(b) can be applied to the net 201 and 203 shown in FIGS. 3(a)-3(i). The steps preceding step 16 are not shown. The input to step 16 is the geometry information generated from the layout file provided at step 11. The following paragraph describes the geometry information in general terms, instead of the accurate geometry information which may be processed by a computer file.

Figure 3A:
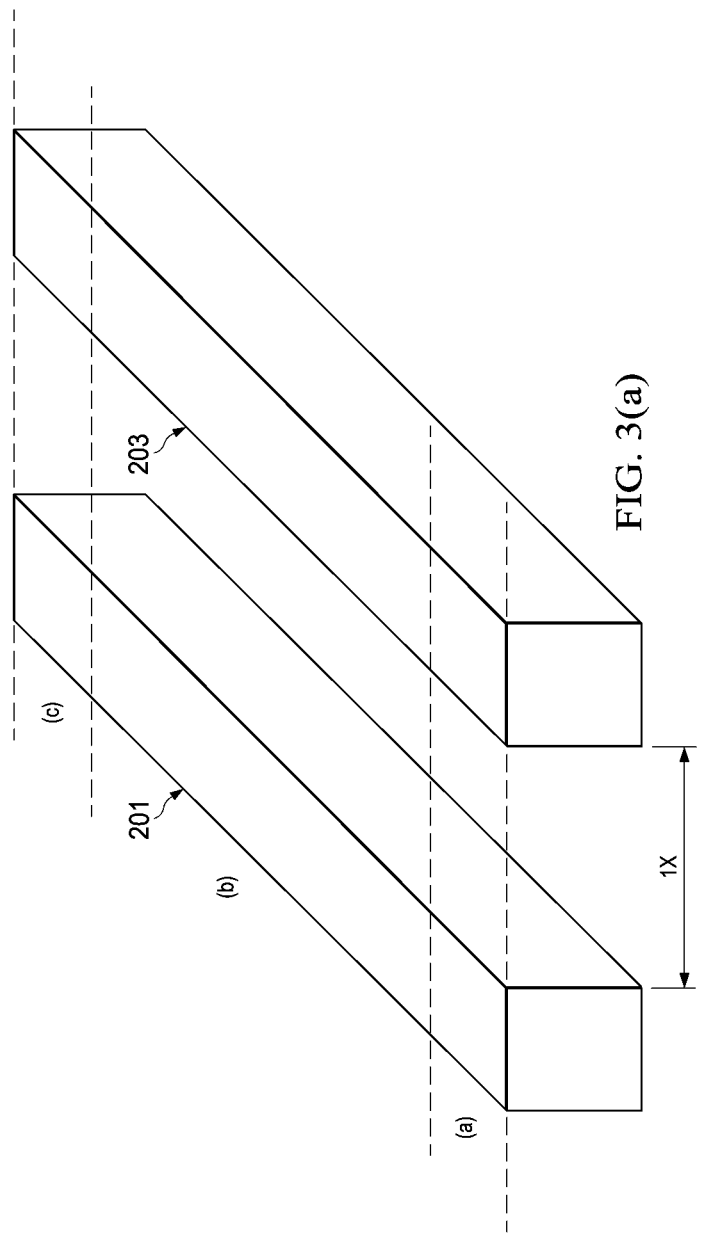
Figure 3D:
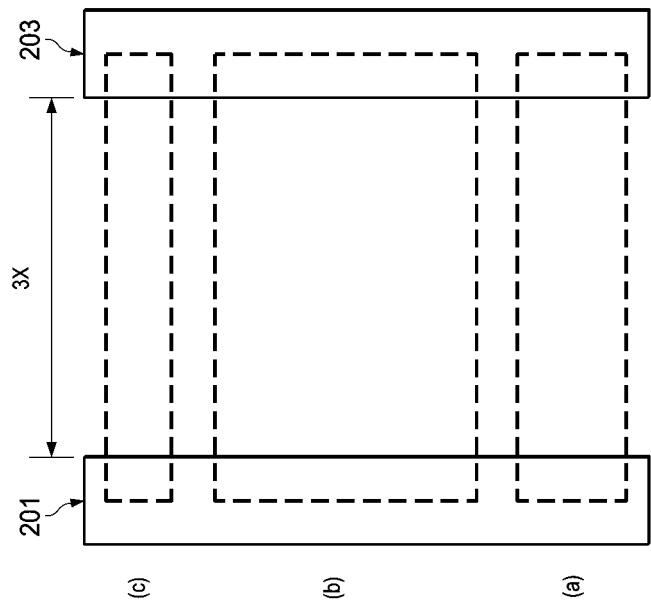
Figure 3B:
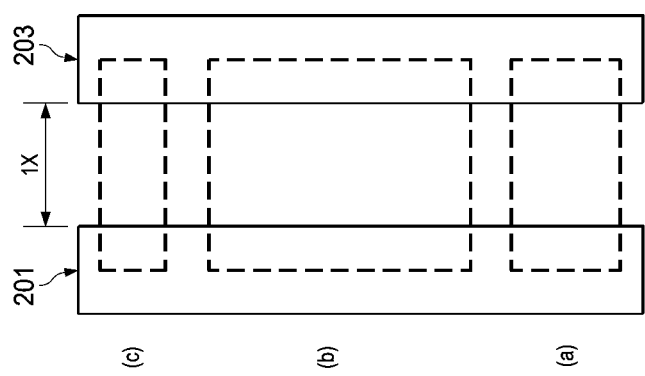
Figure 3C:
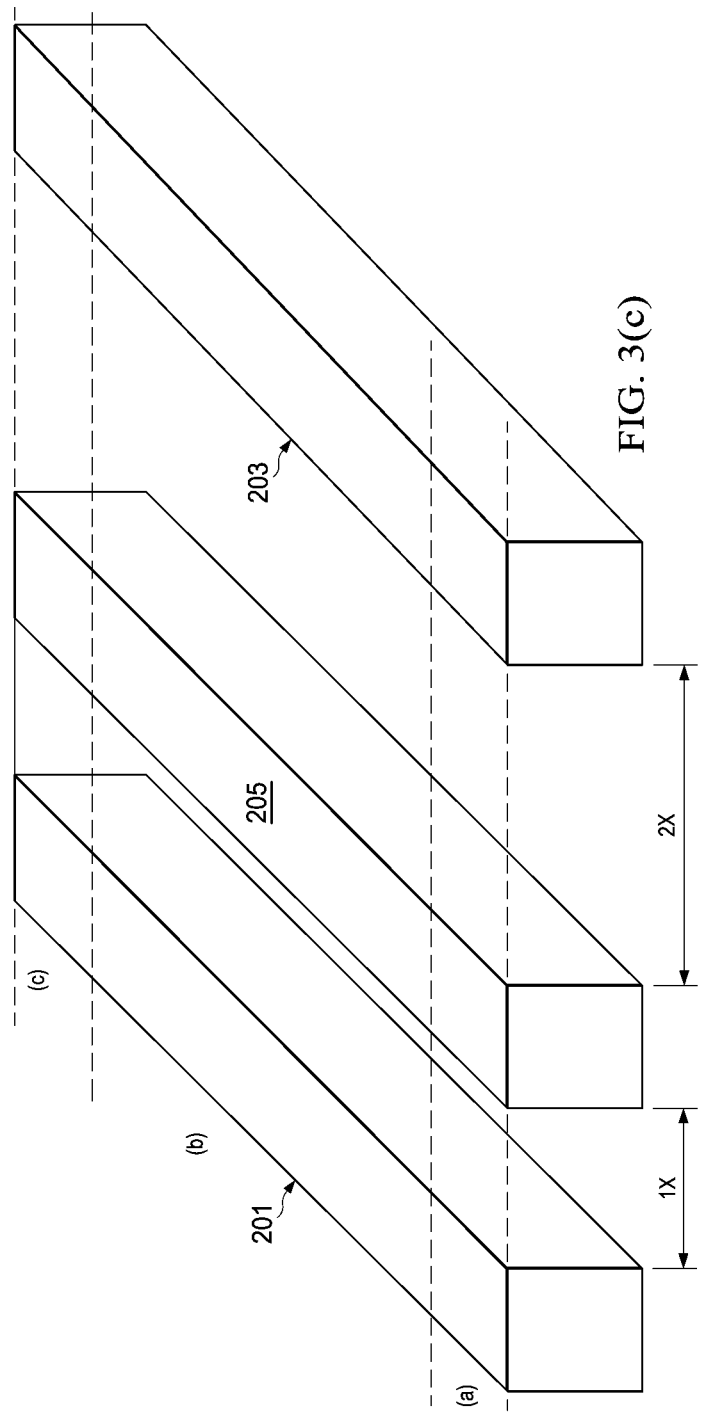
Figure 3E:
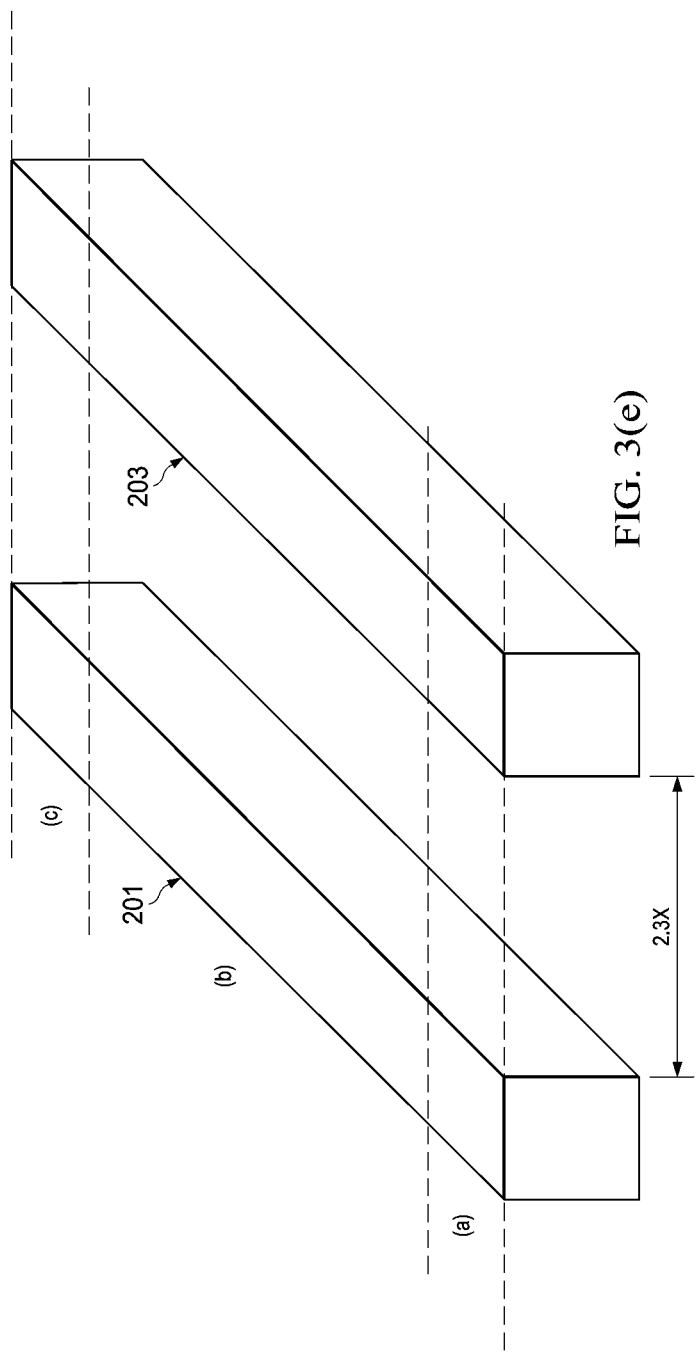
Figure 3H:
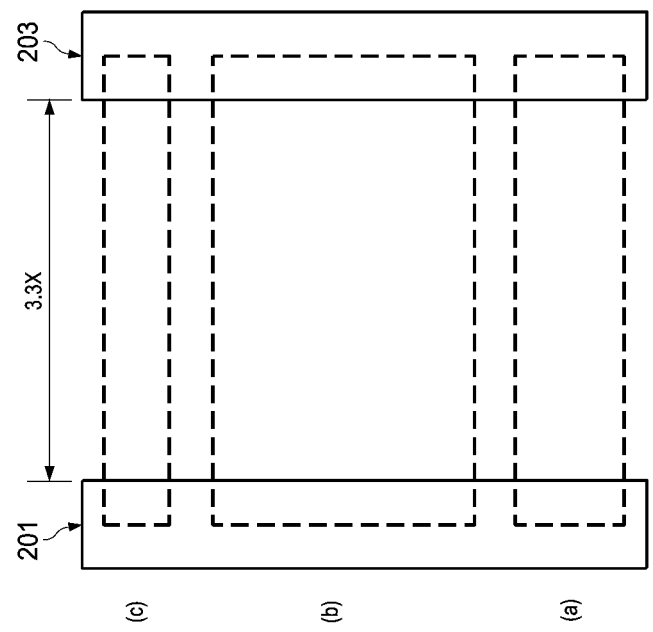
Figure 3F:
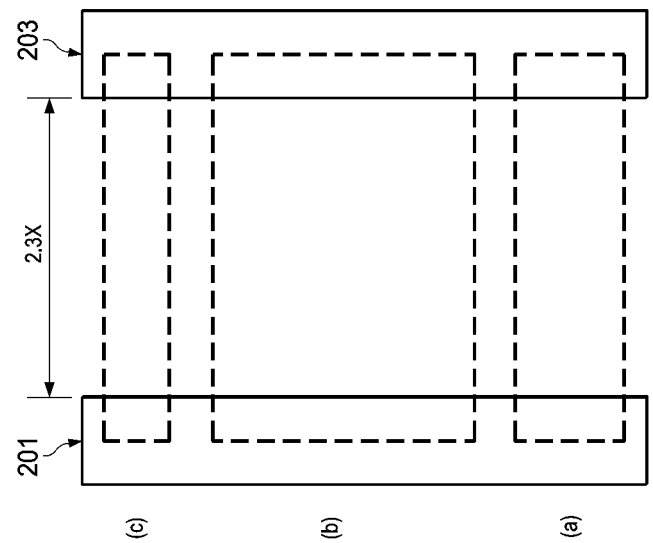
Figure 3G:
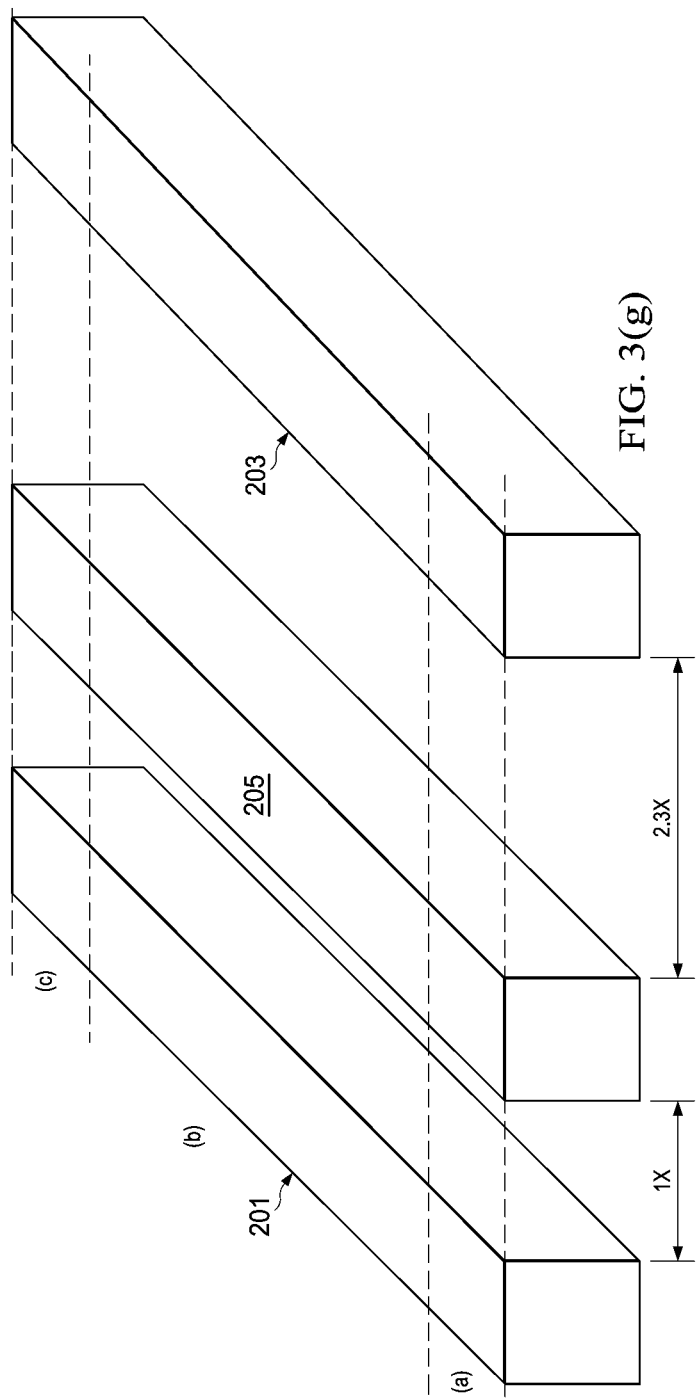

As illustrated in FIGS. 3(a)-3(h), the first net 201 and the second net 203 are at a BEOL metal layer and at a same layer. There may be an additional net 205 between the net 201 and the net 203 as shown in FIGS. 3(c) and 3(g). The presence of the addition net 205 demonstrates that the method presented here applies to two nets adjacent to each other as in FIG. 3(a), as well as to the case when two nets are not adjacent to each other as in FIG. 3(c). FIGS. 3(a), 3(c), 3(e), and 3(g) show a three dimensional view of the nets 201 and 203, while FIGS. 3(b), 3(d), 3(f), 3(h), and 3(i) show a top view of the nets 201 and 203.

The width between the net 201 and the net 203 are of a regular distance 1X in FIGS. 3(a) and 3(b), and 1X+2X=3X in FIGS. 3(c) and 3(d). On the other hand, the width between the net 201 and the net 203 are of an irregular distance 2.3X in FIGS. 3(e) and 3(f), and 1X+2.3X=3.3X in FIGS. 3(g) and 3(h).

The geometry information described above can be used to decompose the net 201 and the net 203 into a plurality of components at step 17 of the method 10 shown in FIGS. 1(a)-1(b). As shown in FIGS. 3(a)-3(h), the net 201 and the net 203 are decomposed into three component pairs. The pair of components marked as the (a) pair and the (c) pair comprising an end component of the net 201, and an end component of the net 203. The pair of components marked as the (b) pair comprises a component at the middle of the net 201 and the net 203. The length of the components of (a), (b), and (c) are of regular length.

A library of net components may be provided at step 18 of the method 10 shown in FIG. 1(b). The library may be a techfile for a 2.5D capacitance extraction method. Each entry of the library may comprise a component pair and a pre-calculated capacitance for the component pair, wherein the component pair has a component of the first net and a component of the second net. The 2.5D techfile library may be derived using a 3D equation solver which determines the capacitance of a plurality of net components ahead of time.

After net 201 and the net 203 have been decomposed into a plurality of components at step 17 as described above, component capacitances of pairs of components can be obtained by applying step 19b of the method 10 shown in FIG. 1(b). For each pair of components described above, step 19b tests a condition to obtain a condition result, which will be used to determine how to obtain the component capacitance for the pair of components. If the pair of components can be found a matching entry in the library, then the component capacitance of the pair can be determined at step 21b based on the pre-calculated capacitance stored in the library. If there is no matching entry, then a 3D equation solver at step 25 or a 2D equation solver at step 27 may be used to obtain the component capacitance for the pair. Details of the operations are substantially similar to the descriptions for the examples in FIGS. 2(a)-2(h).

For the pairs (a), (b), and (c) in FIGS. 3(a)-3(d), their length and width are regular, therefore their capacitance can be determined as $(a)_{techfile}*L$, $(b)_{techfile}$, and $(c)_{techfile}*L$ for example, where L is the length of the pair (a) and the pair (c). For the pairs (a), (b), and (c) in FIGS. 3(e)-3(h), its capacitance can be determined as $(a)_{on\text{-}the\text{-}fly\ calculation}$, $(b)_{on\text{-}the\text{-}fly\ calculation}$, and $(c)_{on\text{-}the\text{-}fly\ calculation}$, since they are of an irregular width. The component capacitance for the pairs (a), (b), and (c) may be determined by a 2D equation solver for FIGS. 3(f) and 3(h), or a 3D equation solver for FIGS. 3(e) and 3(g).

Finally, at step 29, the method 10 determines a net capacitance of the first net and the second net based on the component capacitance for each pair of components. For example, for the net 201 and the second net 203 in FIGS. 3(a)-3(d), the net capacitance may be a sum of the component capacitance of each pair of components which are all based on the stored capacitances in the library, $C_{201,203}=(a)_{techfile}*L+(b)_{techfile}+(c)_{techfile}*L$. On the other hand, for the net 201 and the second net 203 in FIGS. 3(e)-3(h), the net capacitance may be a sum of the component capacitance of each pair of components, which are obtained by an equation solver on the fly, $C_{201,203}=(a)_{on\text{-}the\text{-}fly\ calculation}+(b)_{on\text{-}the\text{-}fly\ calculation}+(c)_{on\text{-}the\text{-}fly\ calculation}$.

Similarly, for the example in FIG. 3(i), for the net 201 and the net 205, the net capacitance may be a sum of the component capacitance of each pair of components, $C_{201,205}=(a)_{techfile}*L+(b)_{on\text{-}the\text{-}fly\ calculation}+(c)_{techfile}*L$, since both (a) and (c) pair are of regular width and length, while the pair (b) has an irregular length marked as 1.7X. Similarly, for the nets 205 and 203, the net capacitance may be a sum of the component capacitance of each pair of components, $C_{205,203}=(a)_{on\text{-}the\text{-}fly\ calculation}+(b)_{on\text{-}the\text{-}fly\ calculation}+(c)_{on\text{-}the\text{-}fly\ calculation}$, since all pairs (a), (b), and (c) are of irregular width 2.3X. Details for the process of applying the method steps for the example in FIG. 3(i) are similar as those details for previous examples.

Figure 4A:
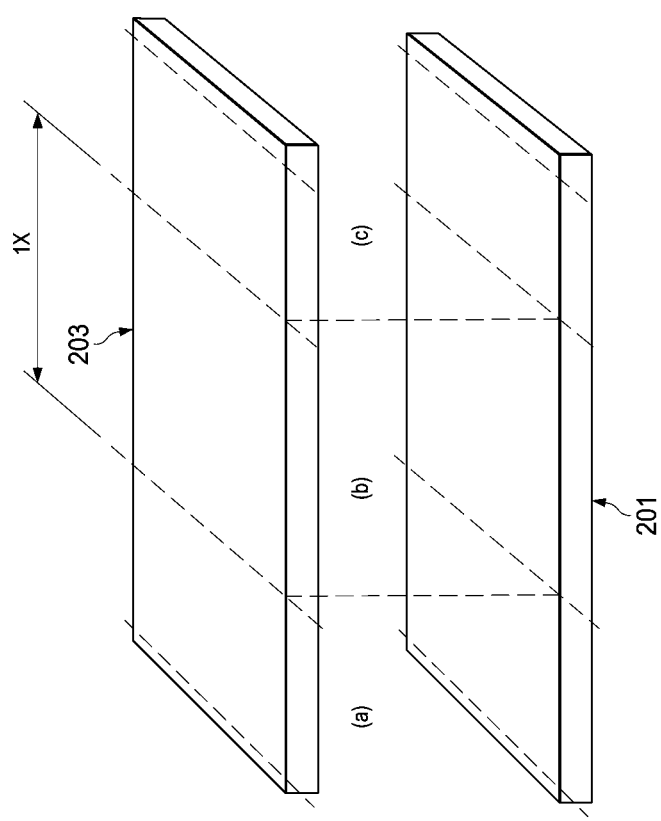

FIGS. 4(a)-4(b) illustrate examples for the capacitance extraction of two nets in overlay layers, in accordance with some embodiments. The first net 201 is at a first metal layer, and the second net 203 is a second metal layer different from the first metal layer. The geometry information for the net 201 and 203 can be used to decompose the net 201 and 203 into three pair of components (a), (b), (c), as previously demonstrated for FIGS. 2(a)-2(h) and FIGS. 3(a)-3(i). The three component pairs (a), (b), and (c) in FIG. 4(a) all have regular length and width as shown and marked by 1X, which could be found in the library provided to obtain its capacitance. On the other hand, the pairs (a) and (c) in FIG. 4(b) have regular length and width, which can be found in the library, while the pair (b) has an irregular length 2.3X, which cannot be found in the library. Therefore the net capacitance for the net 201 and 203 in FIG. 4(a) is obtained by $(a)_{techfile}*L+(b)_{techfile}+(c)_{techfile}*L$, and the net capacitance for the net 201 and 203 in FIG. 4(b) is obtained by $(a)_{techfile}*L+(b)_{on\text{-}the\text{-}fly}+(c)_{techfile}*L$.

Figure 5:
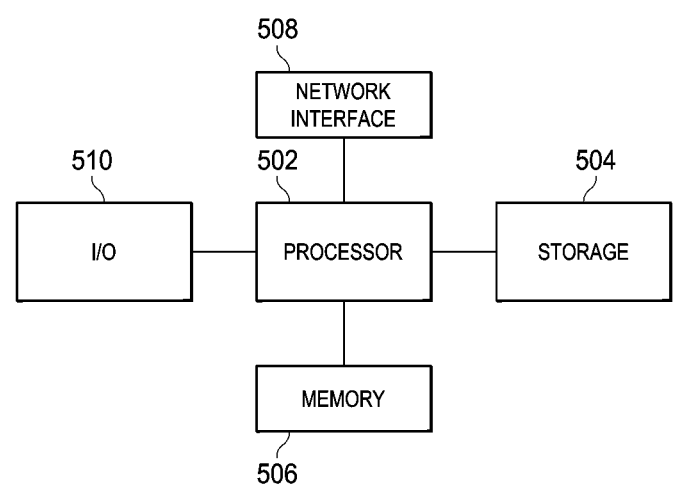
FIG. 5 illustrates an exemplary capacitance extraction system, in accordance with some embodiments.

The methods described herein can be implemented in software stored on a computer-readable medium and executed on a computer. Some of the disclosed methods, for example, can be implemented as part of an EDA or CAD tool. Such methods can be executed on a single computer or a networked computer. FIG. 5 illustrates such a computer system for implementing the methods.

The unit 500 may contain a processor 502 that controls the overall operation of the controller 500 by executing computer program instructions which define such operation. Processor 502 may include one or more central processing units, read only memory (ROM) devices and/or random access memory (RAM) devices. The processor 502 may be an ASIC, a general purpose processor, a Digital Signal Processor, a combination of processors, a processor with dedicated circuitry, dedicated circuitry functioning as a processor, and a combination thereof.

The computer program instructions may be stored in a storage device 504 (e.g., magnetic disk, database, etc.) and loaded into memory 506 when execution of the computer program instructions is desired. Thus, applications for performing the herein-described method steps can be defined by the computer program instructions stored in the memory 506 or storage 504 and controlled by the processor 502 executing the computer program instructions.

In alternative embodiments, hard-wired circuitry or integrated circuits may be used in place of, or in combination with, software instructions for implementation of the processes of the present invention. Thus, embodiments of the present invention are not limited to any specific combination of hardware, firmware, or software. The memory 506 may store the software for the controller 500, which may be adapted to execute the software program and thereby operate in accordance with the present invention and particularly in accordance with the methods described in detail above. However, the invention as described herein could be implemented in many different ways using a wide range of programming techniques as well as general purpose hardware sub-systems or dedicated controllers.

The unit 500 may also include one or more network interfaces 508 for communicating with other devices via a network. In wireless portions of the network, the network interface could include an antenna and associated processing. In wired portions of the network, the network interface could include connections to the cables that connect the unit to other units. In either case, the network interface could be thought of as circuitry for accessing the physical communications portions (such as the antenna).

The unit 500 could also include input/output devices 510 (e.g., display, keyboard, mouse, speakers, buttons, etc.) that enable user interaction with the controller 500. These user I/O devices are optional and not needed if the unit 500 is accessed by the network interfaces only.

An implementation of unit 500 could contain other components as well, and that the controller of FIG. 5 is a high level representation of some of the components of such a controller for illustrative purposes.

A method for extracting a capacitance from a layout of an integrated circuit (IC) is disclosed. The method receives a computer file of a layout, wherein the layout comprises a first net and a second net. The method decomposes the first net into a first component and a second component, and decomposes the second net into a third component and a fourth component. The method then tests a first condition for the first component and the third component to obtain a first condition result, and tests the first condition for the second component and the fourth component to obtain a second condition result. Based on the first condition result, the method obtains a first capacitance for the first component and the third component by a first method, and obtains a second capacitance for the second component and the fourth component by a second method different from the first method. Finally the method determines a net capacitance of the first net and the second net based on the first capacitance and the second capacitance.

A system for extracting a capacitance from a layout of an integrated circuit (IC) is disclosed. The system comprises a receiving unit to receive a computer file of a layout, wherein the layout comprises a first net and a second net. The system comprises a processing unit, wherein the processing unit decomposes the first net into a first component and a second component, and decomposes the second net into a third component and a fourth component. The system further comprises a testing unit, wherein the testing unit tests a first condition for the first component and the third component to obtain a first condition result, and tests the first condition for the second component and the fourth component to obtain a second condition result. The system further comprises a computing unit, wherein the computing unit computes a first capacitance for the first component and the third component by a first method, computes a second capacitance for the second component and the fourth component by a second method different from the first method, and computes a net capacitance of the first net and the second net based on the first capacitance and the second capacitance.

A method for extracting a capacitance from a layout of an integrated circuit (IC) is disclosed. The method receives a computer file of a layout, wherein the layout comprises a first net and a second net. The method decomposes the first net into a first component and a second component, and decomposes the second net into a third component and a fourth component. The method also provides a library with a plurality of entries, each entry having a component pair comprising a component of the first net and a component of the second net, and a pre-calculated capacitance for the component pair. The method searches the library to find whether there is a matching entry in the library that matches the first component and the third component. The method obtains a first capacitance for the first component and the third component based on the pre-calculated capacitance for the matching entry in the library. The method obtains a second capacitance for the second component and the fourth component by applying an equation solver on the fly to the second component and the fourth component when there is no matching entry in the library. The method finally determines a net capacitance of the first net and the second net based on the first capacitance and the second capacitance.

The current methods and systems may work for resistance extraction as well as for capacitance extraction. The RC extraction step converts a physical design layout back into representative electrical circuit elements, and measures the actual shapes and spaces in the lithography mask layers to predict the resulting electrical characteristics, such as the capacitance the resistance in the electronic devices and on the various interconnects (also generally referred to as "nets") that electrically connect the aforementioned devices.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for extracting a capacitance from a layout of an integrated circuit (IC), comprising:
  receiving a computer file of a layout by a computer, wherein the layout comprises a first net and a second net;
  decomposing by a processing unit of the computer, the first net into a first component and a second component;
  decomposing by the processing unit of the computer, the second net into a third component and a fourth component;
  testing a first condition for the first component and the third component to obtain a first condition result;
  obtaining a first capacitance for the first component and the third component by a first method based on the first condition result;
  testing the first condition for the second component and the fourth component to obtain a second condition result;
  testing a second condition, based on the second condition result, for the second component and the fourth component to obtain a third condition result;
  obtaining a second capacitance for the second component and the fourth component by a second method different from the first method based on the third condition result; and
  determining by a computing unit of the computer, a net capacitance of the first net and the second net based on the first capacitance and the second capacitance.

2. The method of claim 1, further comprising:
  decomposing the first net into a first plurality of components;
  decomposing the second net into a second plurality of components;
  testing the first condition for each pair of a plurality of component pairs to obtain a component condition result, each pair of the plurality of component pairs comprising a component from the first plurality of components, and a component from the second plurality of components;
  obtaining a component capacitance for each pair of the plurality of component pairs by one of a plurality of methods based on the component condition result; and
  determining the net capacitance of the first net and the second net based on the component capacitance for each pair of the plurality of component pairs.

3. The method of claim 1, further comprising:
  testing the first condition for the first component and the third component to obtain the first condition result;
  testing the second condition, based on the first condition result, for the first component and the third component to obtain a fourth condition result;
  obtaining the first capacitance for the first component and the third component by a third method based on the fourth condition result; and
  determining the net capacitance of the first net and the second net based on the first capacitance.

4. The method of claim 1, further comprising:
  providing a library with a plurality of entries, each entry having a component pair comprising a component of the first net and a component of the second net, and a pre-calculated capacitance for the component pair;
  testing the first condition for the first component and the third component is to search the library to find whether there is a matching entry in the library that matches the first component and the third component, the first condition result is yes when there is a matching entry found, and no for otherwise; and obtaining the first capacitance for the first component and the third component based on the pre-calculated capacitance for the matching entry in the library when the first condition result is yes.

5. The method of claim 4, further comprising:
testing the first condition for the first component and the third component is to search the library to find whether there is a matching entry in the library that matches the first component and the third component, the first condition result is yes when there is a matching entry found, and no for otherwise;
testing the second condition to determine an equation solver to be applied to the first component and the third component when the first condition result is no; and
obtaining the first capacitance for the first component and the third component by applying the equation solver on the fly to the first component and the third component.

6. The method of claim 5, wherein the equation solver is a two-dimensional equation solver or a three-dimensional equation solver.

7. The method of claim 4, wherein testing the first condition for the first component and the third component is to search the library by a length, a width, or a height of the first component.

8. The method of claim 1, wherein the net capacitance is a lateral capacitance, an overlay capacitance, or a fringe capacitance.

9. The method of claim 1, wherein the first net and the second net are at a back end of the line (BEOL) metal layer.

10. The method of claim 1, wherein the first net is a metal gate above a plurality of fins of a FinFET transistor.

11. The method of claim 1, wherein the first net is at a first metal layer, and the second net is at a second metal layer different from the first metal layer.

12. The method of claim 1, wherein the first component is at an end point of the first net, and the second component comprises a middle point of the first net.

13. The method of claim 1, wherein the first component is between two fins of a FinFET transistor.

14. The method of claim 1, wherein the net capacitance is a sum of the first capacitance and the second capacitance.

15. A system for extracting a capacitance from a layout of an integrated circuit (IC), comprising:
a receiving unit to receive a computer file of a layout, wherein the layout comprises a first net and a second net;
a processing unit, wherein the processing unit decomposes the first net into a first component and a second component, and decomposes the second net into a third component and a fourth component;
a testing unit, wherein the testing unit tests a first condition for the first component and the third component to obtain a first condition result, tests the first condition for the second component and the fourth component to obtain a second condition result, and tests a second condition, based on the second condition result, for the second component and the fourth component to obtain a third condition result; and
a computing unit, wherein the computing unit computes a first capacitance for the first component and the third component by a first method based on the first condition result, computes a second capacitance for the second component and the fourth component by a second method different from the first method based on the third condition result, and computes a net capacitance of the first net and the second net based on the first capacitance and the second capacitance.

16. The system of claim 15, further comprising:
a library providing a plurality of entries, each entry having a component pair comprising a component of the first net and a component of the second net, and a pre-calculated capacitance for the component pair, wherein:
the testing unit tests the first condition for the first component and the third component to obtain the first condition result is to search the library to find whether there is a matching entry in the library that matches the first component and the third component, the first condition result is yes when there is a matching entry found, and no for otherwise; and
the computing unit computes the first capacitance for the first component and the third component based on the pre-calculated capacitance for the matching entry in the library when the first condition result is yes, and computes the first capacitance for the first component and the third component by applying an equation solver on the fly when the first condition result is no.

17. A method for extracting a capacitance from a layout of an integrated circuit (IC), comprising:
receiving a computer file of a layout by a computer, wherein the layout comprises a first net and a second net;
decomposing the first net into a first component and a second component;
decomposing the second net into a third component and a fourth component;
providing a library stored by the computer, with a plurality of entries, each entry having a component pair comprising a component of the first net and a component of the second net, and a pre-calculated capacitance for the component pair;
searching the library to find whether there is a matching entry in the library that matches the first component and the third component, a first condition result is yes when there is a matching entry found, and no for otherwise;
obtaining a first capacitance for the first component and the third component based on the pre-calculated capacitance for the matching entry in the library when the first condition result is yes;
searching the library to find whether there is a matching entry in the library that matches the second component and the fourth component, a second condition result is yes when there is a matching entry found, and no for otherwise;
obtaining a second capacitance for the second component and the fourth component by applying an equation solver on the fly to the second component and the fourth component when the second condition result is no, wherein the equation solver is a two-dimensional equation solver or a three-dimensional equation solver; and
determining a net capacitance of the first net and the second net based on the first capacitance and the second capacitance.

18. The method of claim 17, wherein searching the library for the first component and the third component is to search the library by a length, a width, or a height of the first component.

19. The method of claim 17, wherein the net capacitance is a lateral capacitance, an overlay capacitance, or a fringe capacitance.

* * * * *